United States Patent
Wang et al.

(10) Patent No.: US 10,529,781 B2
(45) Date of Patent: Jan. 7, 2020

(54) ORGANIC LIGHT-EMITTING DIODE DISPLAY PANEL AND ORGANIC LIGHT-EMITTING DIODE DISPLAY DEVICE

(71) Applicants: Shanghai Tianma AM-OLED Co., Ltd., Shanghai (CN); Tianma Micro-Electronics Co., Ltd., Shenzhen (CN)

(72) Inventors: Xiangcheng Wang, Shanghai (CN); Jinghua Niu, Shanghai (CN); Wei He, Shanghai (CN); Yuji Hamada, Shanghai (CN); Chen Liu, Shanghai (CN); Honggang Yan, Shanghai (CN)

(73) Assignees: SHANGHAI TIANMA AM-OLED CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 38 days.

(21) Appl. No.: 15/596,010

(22) Filed: May 16, 2017

(65) Prior Publication Data
US 2017/0256595 A1    Sep. 7, 2017

(30) Foreign Application Priority Data
Nov. 21, 2016 (CN) .......................... 2016 1 1039249

(51) Int. Cl.
*H01L 27/32* (2006.01)
*G09G 3/34* (2006.01)
(Continued)

(52) U.S. Cl.
CPC ........ *H01L 27/3211* (2013.01); *G09G 3/3413* (2013.01); *G09G 3/2003* (2013.01);
(Continued)

(58) Field of Classification Search
CPC ............ H01L 27/3211; H01L 51/5234; H01L 51/5271; H01L 51/5036; H01L 51/0097;
(Continued)

(56) References Cited

U.S. PATENT DOCUMENTS 7,733,014 B2 *  6/2010  Iou ...................... H01L 51/5036
                                                                313/506
2002/0180671 A1 * 12/2002  Inukai .................. G09G 3/2011
                                                                345/76
(Continued)

FOREIGN PATENT DOCUMENTS

KR     20030024993 A     3/2003

*Primary Examiner* — William F Kraig
*Assistant Examiner* — Vicki B. Booker
(74) *Attorney, Agent, or Firm* — Anova Law Group PLLC

(57) ABSTRACT

An organic light-emitting diode (OLED) display panel and an OLED display device are provided. The (OLED) display panel includes a first substrate; a first electrode layer disposed on the first substrate and including a plurality of first electrodes; a plurality of light-emitting devices disposed on a surface of the first electrode layer far away from the first substrate and having m number of colors, where m is a positive integer; and a second electrode layer disposed on a surface of the plurality of light-emitting devices far away from the first electrode layer. One light-emitting device corresponds to one color, and given a predetermined value of brightness, the light-emitting devices of two different colors are configured to have a predetermined absolute value of a threshold voltage difference.

18 Claims, 3 Drawing Sheets

(51) Int. Cl.
*H01L 51/00* (2006.01)
*H01L 51/50* (2006.01)
*H01L 51/52* (2006.01)
*G09G 3/3233* (2016.01)
*G09G 3/3258* (2016.01)
*G09G 3/20* (2006.01)

(52) U.S. Cl.
CPC ......... *G09G 3/3233* (2013.01); *G09G 3/3258* (2013.01); *G09G 2300/0426* (2013.01); *G09G 2300/0452* (2013.01); *G09G 2380/02* (2013.01); *H01L 51/0097* (2013.01); *H01L 51/5036* (2013.01); *H01L 51/5234* (2013.01); *H01L 51/5271* (2013.01)

(58) Field of Classification Search
CPC .. G09G 3/3413; G09G 3/2003; G09G 3/3258; G09G 2380/02; G09G 2300/0452; G09G 2300/0426; G09G 3/3233
See application file for complete search history.

(56) References Cited

U.S. PATENT DOCUMENTS

| | | | |
|---|---|---|---|
| 2008/0038587 A1* | 2/2008 | Wen | C07C 211/61 428/704 |
| 2010/0187984 A1* | 7/2010 | Lin | C07D 491/04 313/504 |
| 2011/0025212 A1* | 2/2011 | Kolosov | H01L 27/3225 315/185 R |
| 2014/0252317 A1* | 9/2014 | Gupta | H01L 51/5203 257/40 |
| 2015/0115249 A1* | 4/2015 | Lin | H01L 51/5209 257/40 |
| 2016/0111674 A1* | 4/2016 | Bae | H01L 51/5218 257/40 |
| 2017/0125686 A1* | 5/2017 | Heil | C07C 255/50 |
| 2017/0155075 A1* | 6/2017 | Bi | H01L 51/525 |
| 2018/0138243 A1* | 5/2018 | Wang | H01L 27/322 |

* cited by examiner

ORGANIC LIGHT-EMITTING DIODE DISPLAY PANEL AND ORGANIC LIGHT-EMITTING DIODE DISPLAY DEVICE

CROSS-REFERENCES TO RELATED APPLICATIONS

This application claims priority of Chinese Patent Application No. 201611039249.9, filed on Nov. 21, 2016, the entire contents of which are hereby incorporated by reference.

BACKGROUND

An organic light-emitting diode (OLED) display panel is a self-luminous display device with an organic thin film as a luminous body, which has the advantages of ultra-thin thickness, high brightness, high luminous efficiency and good shock resistance. In an OLED display panel, each subpixel area is often defined by a pixel definition layer. To improve the package or encapsulation of the subpixel, spacers are provided on the pixel defining layer between any two adjacent subpixels.

However, in an existing OLED display panel, subpixels adjacent to a subpixel which is turned on may emit undesired light, such that the crosstalk of the OLED display panel may be increased, and the display performance of the OLED display panel may be degraded.

The disclosed OLED display panel and OLED display device thereof are directed to solve one or more problems set forth above and other problems.

BRIEF SUMMARY OF THE DISCLOSURE

One aspect of the present disclosure provides an organic light-emitting diode (OLED) display panel. The (OLED) display panel comprises a first substrate; a first electrode layer disposed on the first substrate and including a plurality of first electrodes; a plurality of light-emitting devices disposed on a surface of the first electrode layer far away from the first substrate and having m number of colors, where m is a positive integer, wherein one light-emitting device corresponds to one color, and given a predetermined value of brightness, the light-emitting devices of two different colors are configured to have a predetermined absolute value of a threshold voltage difference; and a second electrode layer disposed on a surface of the plurality of light-emitting devices far away from the first electrode layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

Figure 1:
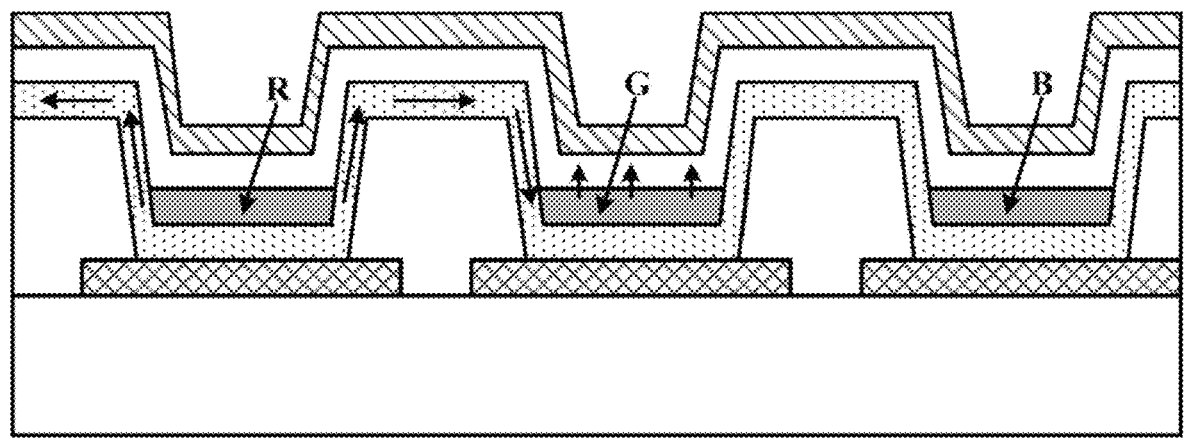
FIG. 1 illustrates a schematic view of an existing organic light-emitting diode (OLED) display panel.

FIG. 1 illustrates a schematic view of an existing organic light-emitting diode (OLED) display panel. As shown in FIG. 1, the OLED display panel includes a plurality of subpixels, where the red subpixel R, the green subpixel G and the blue subpixel B are arranged alternately. When the red subpixel R is intentionally lit or turned on, the carriers in the red subpixel R may drift laterally to the surrounding subpixels, for example, drift laterally to the adjacent green subpixel G. Consequently, the green subpixel G may emit visible green light due to the high luminous efficiency of the green subpixel G.

That is, the green subpixel G is undesirably lit or emits undesired light when the red subpixel R is intentionally lit. Accordingly, the red subpixel R is undesirably lit when the green subpixel G is intentionally lit. The red subpixel R and the green subpixel G are undesirably lit when the blue subpixel B is intentionally lit. As a result, the crosstalk of the OLED display panel may be increased, and the display performance of the OLED display panel may be degraded accordingly.

The present disclosure provides an improved display panel capable of suppressing the undesired light emitted by the adjacent subpixels and, thus, reducing the crosstalk and improving the display performance.

Figure 2:
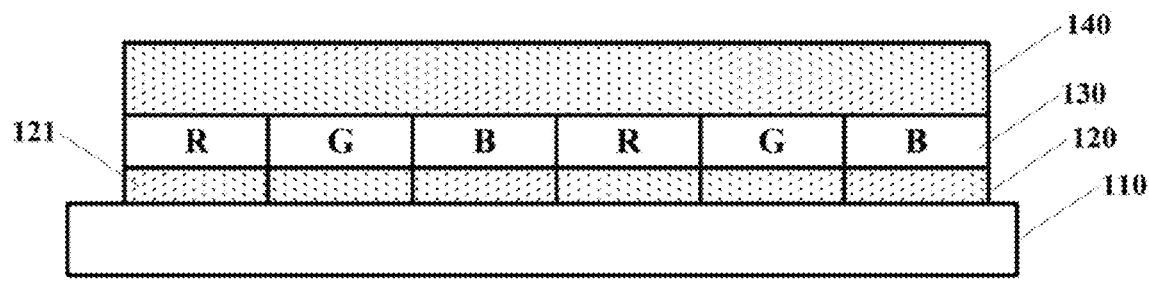
FIG. 2 illustrates a schematic view of an exemplary OLED display panel consistent with disclosed embodiments.

FIG. 2 illustrates a schematic view of an exemplary OLED display panel consistent with disclosed embodiments. As shown in FIG. 2, the OLED display panel 200 may comprise: a first substrate 110, a first electrode layer 120, a plurality of light-emitting devices 130, a second electrode layer 140, and a plurality of first electrodes 121. Other appropriate components may also be included.

In particular, the first electrode layer 120 may be disposed on the first substrate 110, and the first electrode layer 120 may include the plurality of first electrodes 121. The plurality of light-emitting devices 130 may be disposed on the surface of the first electrode layer 120 far away from the first substrate 110. The plurality of light-emitting devices 130 may be disposed in correspondence with the plurality of first electrodes 121 respectively. That is, the plurality of light-emitting devices 130 may be disposed one-to-one corresponding to the plurality of first electrodes 121. The second electrode layer 140 may be disposed on the plurality of light-emitting devices 130 far away from the first electrode layer 120.

The plurality of light-emitting devices 130 may have m number of colors, where m is a positive integer. Given a predetermined value of brightness, the absolute value of the threshold voltage difference between the light-emitting devices 130 of two different colors may be configured to be a predetermined value or within a predetermined range, where in one embodiment, the predetermined value of brightness may refer to the minimum luminance value for the human eyes to recognize the light emitted by the light-emitting device 130.

In one embodiment, m may be a positive integer greater than or equal to 3. The absolute value of the threshold voltage difference of light-emitting devices 130 of any two colors under the predetermined value of brightness (e.g., minimum value of visible brightness) may be configured to be less than or equal to approximately 0.3 V.

The first substrate 110 may be made of rigid transparent materials (e.g., glass) or flexible transparent materials (e.g., polyimide). The light-emitting device may include organic light-emitting diode (OLED) devices, quantum dots (QDs) light-emitting devices, or other appropriate light-emitting devices capable of emitting light for displaying videos and/or images.

In one embodiment, as shown in FIG. 2, the first substrate 110 may be a flexible substrate, and the light-emitting device may be an OLED device. That is, the corresponding OLED display panel 200 may be a flexible OLED display panel. The flexible OLED display panel may have characteristics such as low power consumption and good flexibility, and may be applicable to various display devices, such as wearable display devices. The material of the flexible substrate may include polyimide or polyethylene terephthalate resin, which is for illustrative purposes and is not intended to limit the scope of the present disclosure. Any appropriate materials suitable for the flexible substrate fall within the scope of the disclosure.

In another embodiment, the first substrate may be a rigid substrate and, accordingly, a rigid OLED display panel may be provided. The rigid OLED display panel may have broad applications and will not be further described in the present disclosure. In practical applications, the materials of the first substrate may be selected according to various application scenarios.

In the disclosed embodiments, the first electrode layer 120 may be disposed on the first substrate 110, and the first electrode layer 120 may include the plurality of first electrodes 121. The second electrode layer 140 may be disposed on the surface of the plurality of light-emitting devices 130 far away from the first electrode layer 120.

In one embodiment, as shown in FIG. 2, the first electrode layer 120 may be an anode of the OLED display panel 200, and the second electrode layer 140 may be a cathode of the OLED display panel 200. That is, a positive voltage may be applied to the first electrodes 121 of the first electrode layer 120 during electroluminescence, and a negative voltage may be applied to the second electrode layer 140 during electroluminescence.

The first electrode layer 120 may include a high work function material, such as indium tin oxide or tin-doped indium oxide (ITO) having a work function as high as approximately 4.5 eV to 5.3 eV, good stability and high transparency. In one embodiment, the first electrode 121 may include at least: a reflective film and a transparent conductive film. The reflective film may be disposed on the first substrate 110, and the material of the reflective film may include silver. The transparent conductive film may be disposed on the surface of the reflective film far away from the first substrate 110, and the material of the transparent conductive thin film may include indium tin oxide (ITO), and indium zinc oxide, etc.

The second electrode layer 140 may include a low work function material such as Ag, Al, Ca, In, Li, Mg, or low work function composite metal materials. For example, the second electrode layer 140 may include at least one of a magnesium-silver alloy, a silver metal, a silver-ytterbium alloy, and a silver-rare earth metal alloy.

The materials and the film configuration of the first electrode layer, and the materials of the second electrode layer are for illustrative purposes and are not intended to limit the scope of the present disclosure. The materials and the film configuration of the first electrode layer and the materials of the second electrode layer may be selected according to various application scenarios.

Further, the plurality of light-emitting devices 130 may be disposed on the surface of the first electrode layer 120 far away from the first substrate 110. That is, the plurality of light-emitting devices 130 may be disposed between the first electrode layer 120 and the second electrode layer 140. The plurality of light-emitting devices 130 may be disposed in correspondence with the first electrodes 121, respectively. Each light-emitting device 130 may be a subpixel.

In the light-emitting device 130, when a positive voltage is applied to the first electrode 121 and a negative voltage is applied to the second electrode layer 140, the holes generated by the first electrode 121 as the anode may be injected into the corresponding light-emitting device 130 and, meanwhile, the electrons generated by the second electrode layer 140 as the cathode may also be injected into the corresponding light-emitting device 130. The binding of the electrons and holes injected into the light-emitting device 130 may generate excitons. Subsequent radiative transition of the excitons may enable the light-emitting device 130 to emit light.

Those skilled in the art would understand that the structures described and illustrated in the disclosed embodiments are only partial structures of an OLED display panel. An OLED display panel also includes other structures such as a glass cover plate and etc., which are not specifically described in the present disclosure.

Further, the light-emitting devices 130 may have m number of colors, where m is a positive integer. In one embodiment, m may be greater than or equal to 3. The light-emitting devices 130 of different colors may emit light in different colors. For example, a red light-emitting device may emit red light, which may be considered as a red subpixel. The material of the light-emitting device may include organic small-molecule light-emitting materials or high-molecular-weight polymer light-emitting materials, which are not limited by the present disclosure.

In one embodiment, as shown in FIG. 2, m may be equal to 3, and the light-emitting devices 130 may include a plurality of red light-emitting devices R, a plurality of green light-emitting devices G, and a plurality of blue light-emitting devices B. In another embodiment, m may be equal to 4, and the light-emitting devices may include a plurality of red light-emitting devices, a plurality of green light-emitting devices, and a plurality of blue light-emitting devices, and further a plurality of yellow light-emitting devices or a plurality of white light-emitting devices. The colors and number of the light-emitting devices are for illustrative purposes and are not intended to limit the scope of the present disclosure. In particular application, the colors and number of the light-emitting devices may vary according to various application scenarios.

In the disclosed embodiments, the predetermined value of brightness may refer to the minimum luminance value for the human eyes to recognize the light emitted by the light-emitting device 130. That is, when the light emitted by the light-emitting device 130 has a luminance value smaller than the predetermined value of brightness, the human eyes may not be able to recognize the light emitted by the light-emitting device 130. When the light emitted by the light-emitting device 130 has a luminance value greater than or equal to the predetermined value of brightness, the human eyes may be able to recognize the light emitted by the light-emitting device 130.

In disclosed embodiments, the predetermined value of brightness of the light-emitting device 130 may be configured to be equal to approximately 0.1 cd/m$^2$. In certain embodiments, the predetermined value of brightness of the light-emitting device may be configured to be less than approximately 0.1 cd/m$^2$. Those skilled in the art would understand that, in the disclosed embodiments, the predetermined value of brightness of the light-emitting device is determined based on the human eyes, i.e., the predetermined value of brightness is the minimum luminance value at which the human eyes are able to recognize the light emitted by the light-emitting device 130.

In certain embodiments, the predetermined value of brightness of the light-emitting device may be greater than approximately 0.1 cd/m$^2$. In certain other embodiments, the predetermined value of brightness of the light-emitting device may be less than approximately 0.1 cd/m$^2$. The predetermined value of brightness of the light-emitting device may vary according to various application scenarios, which is not limited by the present disclosure.

In general, the predetermined value of brightness for the human eyes to recognize is approximately 0.32 cd/m$^2$. However, in the visible spectrum, the human eyes may be more sensitive to the central spectrum (yellow-green) than the both ends of the visible spectrum. Thus, different radiation power may be desired for different wavelengths of monochromatic light, for producing the same visual effect in the human eyes. That is, given a same brightness, the human eyes may be most sensitive to green light, but less sensitive to blue light and red light.

Thus, when the brightness of the light-emitting device 130 is less than approximately 0.32 cd/m$^2$, the human eyes may still be able to recognize the light emitted by the green light-emitting device G. The inventors conducted experiments to suppress the undesired light emitted by the light-emitting device adjacent to the turned-on light-emitting devices. The inventors found that, when the brightness of the light-emitting device 130 is less than approximately 0.1 cd/m$^2$, the human eyes may not be able to recognize light emitted by the light-emitting device 130 of any color. Thus, in the disclosed embodiments, the predetermined value of brightness of the light-emitting device 130 may be configured to be less than or equal to approximately 0.1 cd/m$^2$.

The threshold voltage of the light-emitting device 130 may refer to the minimum effective voltage for the light-emitting device 130 to emit light with the predetermined value of brightness visible to the human eyes. That is, when the threshold voltage is applied to the anode and the cathode of the light-emitting device 130, the luminance value of the light emitted by the light-emitting device 130 under the excitation of the holes and electrons injected into the light-emitting device 130 may be the luminance value of the predetermined value of brightness.

When the voltage applied to the anode and the cathode is less than the threshold voltage of the light-emitting device 130, the luminance value of the light emitted by the light-emitting device 130 under the excitation of the holes and electrons injected into the light-emitting device 130 may be less than the luminance value of the predetermined value of brightness, and the light emitted by the light-emitting device 130 may be invisible to the human eyes.

When the voltage applied to the anode and the cathode is greater than the threshold voltage of the light-emitting device 130, the luminance value of light emitted by the light-emitting device 130 under the excitation of the holes and electrons injected into the light-emitting device 130 may be greater than the luminance value of the predetermined value of brightness, and the light emitted by the light-emitting device 130 may be visible to the human eyes. The brightness and the luminance value of the light emitted by the light-emitting device 130 may be increased when the voltage applied to the anode and the cathode is increased.

To further explain the technical solutions provided the disclosed embodiments, an OLED display panel in which the light-emitting devices are arranged in specific colors will be described as an example. For example, in one embodiment, as shown in FIG. 2, the plurality of light-emitting devices 130 may be arranged in a row direction and a column direction. That is, the plurality of light-emitting devices 130 may be arranged in a matrix. Given m=3, in a row of the light-emitting devices 130, i.e., in a light-emitting device row, the light-emitting devices 130 may be arranged by the colors of red (R), green (G), blue (B), red (R), green (G), blue (B). Every three light-emitting devices 130 in a same row may constitute one pixel. The red light-emitting device R may have a threshold voltage of $V_R$, the green light-emitting device G may have a threshold voltage of $V_G$, and the blue light-emitting device B may have a threshold voltage of $V_B$.

In certain embodiments, the order of the color arrangement of any two adjacent rows of light-emitting devices (i.e., any two adjacent light-emitting device rows) may be different. For example, the first row of light-emitting devices may be arranged in an order of R, G, B, R, G and B, and the second row of light-emitting devices may be arranged in an order of B, R, G, B, R and G, which are for illustrative purposes and are not intended to limit the scope of the present disclosure. In practical applications, the color arranging order of the light-emitting devices may vary according to various application scenarios.

For example, to turn on the blue light-emitting device B, a positive voltage may be applied to the first electrode 121 corresponding to the blue light-emitting device B, and a negative voltage may be applied to the second electrode layer 140. When the difference between the positive voltage and negative voltage is greater than the threshold voltage $V_B$, the holes may be injected from the anode and the electrons may be injected from the cathode into the blue light-emitting device B. In the blue light-emitting device B, the excitons formed by the binding of the injected electrons and holes may enable the blue light-emitting device B to emit blue light visible to the human eyes.

However, some of the carriers injected into the blue light-emitting device B may drift laterally to the light-emitting devices 130 adjacent to the blue light-emitting device B, such as the adjacent green light-emitting device G, then the excitons formed by the binding of the injected electrons and holes in the green light-emitting device G may enable the green light-emitting device G to emit green light by electroluminescence.

When the threshold voltage of the green light-emitting device G differs substantially from the threshold voltage of the blue light-emitting device B at the predetermined value of brightness, the amount of holes and electrons injected into the green light-emitting device G through drifting from the blue light-emitting device B may exceed the amount of holes and electrons injected into the green light-emitting device G through applying the threshold voltage $V_G$ to the green light-emitting device G. Thus, the green light-emitting device G may emit green light having a higher luminance value than the predetermined value of brightness. That is, when the blue light-emitting device B is turned on, the green light-emitting device G may emit undesired light. Similarly, when the blue light-emitting device B is turned on, the red light-emitting device R may also emit undesired light.

To solve one or more problems set forth above, in the disclosed embodiments, the threshold voltage of the light-emitting device may be adjusted to suppress the undesired light. In one embodiment, the absolute value of the threshold voltage difference of the light emitting device 130 of any two colors at the predetermined value of brightness may be configured to be less than or equal to approximately 0.3V.

That is, when some of the carriers in the turned-on light-emitting device 130 drift laterally to the neighboring light-emitting devices 130, because the threshold voltage difference of the light-emitting devices 130 of any two different colors has an absolute value less than or equal to approximately 0.3 V at the predetermined value of brightness, the amount of holes and electrons drifted into the neighboring light-emitting device may not exceed the amount of holes and electrons injected into the neighboring light-emitting device through applying the threshold voltage. Accordingly, the light emitted by the adjacent light-emitting device may have a lower luminance value than the predetermined value of brightness, thereby suppressing the undesired light emitted by the light-emitting device adjacent to the turned-on light-emitting device in the OLED display panel.

For example, in the OLED display panel having $V_R$=1.98 V, $V_G$=2.15 V and $V_B$=2.60 V, the blue light-emitting device B and the red light-emitting device R may have an absolute value of threshold voltage difference greater than approximately 0.3 V. Meanwhile, the blue light-emitting device B and the green light-emitting device G may have an absolute value of threshold voltage difference greater than approximately 0.3 V. According to the test conducted on the display performance of the OLED display panel, when the blue light-emitting device B is turned on, both the red light-emitting device R and the green light-emitting device G emit undesired light substantially.

As a comparison, in the OLED display panel having $V_R$=2.37 V, $V_G$=2.26 V, and $V_B$=2.56 V, the light-emitting devices 130 of any two different colors may have an absolute value of the threshold voltage difference less than or equal to approximately 0.3 V. According to the test conducted on the display performance of the OLED display panel, when the blue light-emitting device B is turned on, the undesired light emitted by each of the red light-emitting device R and the green light-emitting device G is substantially suppressed.

It should be note that, the threshold voltages adopted in the test of the OLED display panels are for illustrative purposes and are not intended to limit the scope of the present disclosure. As long as the light-emitting devices of any two different colors are configured to have an absolute value of the threshold voltage difference less than or equal to approximately 0.3 V, the threshold voltages of the light-emitting devices may be selected according to various application scenarios, which are not limited by the present disclosure.

In the disclosed embodiments, the plurality of light-emitting devices may be disposed between the first electrode layer and the second electrode layer, and may have m number of colors. At the predetermined value of brightness, the light-emitting devices of any two different colors may be configured to have an absolute value of the threshold voltage difference less than or equal to approximately 0.3 V. Through providing the light-emitting devices of any two different colors with a substantially small absolute value of the threshold voltage difference, the undesired light emitted by the light-emitting devices adjacent to the turned-on light-emitting device may be suppressed. Accordingly, the crosstalk of the OLED display panels and devices may be reduced, and the performance of the OLED display panels and devices may be improved.

Further, in one embodiment, the absolute value of the threshold voltage difference of the light-emitting device 130 of any two colors at the predetermined value of brightness may be configured to be less than or equal to approximately 0.2 V, which may have better display performance than the OLED display panel in which the light-emitting devices 130 of any two colors have the absolute value of the threshold voltage difference greater than approximately 0.2 V and less than or equal to approximately 0.3 V at the predetermined value of brightness.

It should be noted that, when the absolute value of the threshold voltage difference of the light-emitting devices of any two colors is reduced, the number of holes and electrons laterally drifted into the adjacent light-emitting devices may also be reduced. Thus, the luminance value of undesired light emitted by the light-emitting devices adjacent to the turned-on light-emitting device may be reduced and, accordingly, the display performance of the OLED display panel may be improved.

For example, in the OLED display panel having $V_B$-$V_R$=0.17 V and $V_G$-$V_R$=0.15 V, according to the test conducted on the display performance, when the light-emitting device 130 of one color is turned on, the OLED display panel emits light evenly, and no undesired light is emitted by the light-emitting devices 130 adjacent to the turn-on light-emitting device.

In the OLED display panel having $V_B$-$V_R$=0.3 V and $V_G$-$V_R$=0.25 V, according to the test conducted on the display performance, when the light-emitting device 130 of one color is turned on, the OLED display panel emits light evenly and no undesired light is emitted by the light-emitting devices 130 adjacent to the turn-on light-emitting device. However, the OLED display panel having $V_B$-$V_R$=0.17 V and $V_G$-$V_R$=0.15 V has a slightly better performance than the OLED display panel having $V_B$-$V_R$=0.3 V and $V_G$-$V_R$=0.25 V.

In another embodiment, the absolute value of the threshold voltage difference between the red light-emitting device R and the green light-emitting device G may be configured to be less than or equal to approximately 0.1 V at the predetermined value of brightness, and the absolute value of the threshold voltage difference between the red light-emitting device R and the blue light-emitting device B may be configured to be less than or equal to approximately 0.2 V at the predetermined value of brightness.

According to the test conducted on the display performance, the OLED display panel having $|V_R-V_G| \le 0.10$ V and $|V_R-V_B| \le 0.20$ V at the predetermined value of brightness has a better performance than the OLED display panel in which the light-emitting devices 130 of any two colors have the absolute value of the threshold voltage difference less than or equal to approximately 0.2 V at the predetermined value of brightness.

The luminous efficiency of the green light-emitting device G may be substantially high. When the red light-emitting device R has the same amount of injected holes and electrons as the green light-emitting device G, the red light-emitting device R may emit light having a smaller luminance value than the green light-emitting device G. To prevent the holes and electrons drifted laterally into the green light-emitting device G from exciting green light having a luminance value higher than the predetermined value of brightness, $|V_R-V_G|$ may have to be configured to be smaller than or equal to approximately 0.10 V at the predetermined value of brightness.

That is, when the red light-emitting device R is turned on, the holes and electrons drifted laterally into the green light-emitting device G may be substantially fewer than the holes and electrons injected into the green light-emitting device G by applying $V_G$. Thus, the green light-emitting device G may not emit light having a luminance value higher than the predetermined value of brightness. Similarly, when the green light-emitting device G is turned on, the holes and electrons drifted laterally into the red light-emitting device R may not stimulate the red light-emitting device R to emit the red light having a luminance value higher than the predetermined value of brightness.

The threshold voltage of the blue light-emitting device B may be substantially high, and $|V_R-V_B|$ may be smaller than or equal to approximately 0.20 V at the predetermined value of brightness. Thus, when the blue light-emitting device B is turned on, the holes and electrons drifted laterally into the red light-emitting device R may be substantially fewer than the holes and electrons injected into the red light-emitting device R by applying $V_R$. Thus, when the blue light-emitting device B is turned on, the red light-emitting device R may not emit red light having a luminance value higher than the predetermined value of brightness.

Similarly, when the red light-emitting device R is turned on, the holes and electrons drifted laterally into the blue light-emitting device B may not excite the blue light-emitting device B to emit blue light having a luminance value higher than the predetermined value of brightness.

When the absolute value of threshold voltage difference between the red light-emitting device R, the green light-emitting device G and the blue light-emitting device B is further reduced, the undesired light emitted from the light-emitting devices adjacent to the turned-on light-emitting device may be further suppressed and, accordingly, the performance of the OLED display panel may be further improved.

For example, in the OLED display panel having $V_B-V_R=0.15$ V and $V_G-V_R=0.14$ V, according to the test conducted on the display performance, when the light-emitting device 130 of any color is turned on, the OLED display panel emits light evenly without undesired light emitted by the light-emitting devices 130 adjacent to the turn-on light-emitting device.

In another example, according to the test conducted on the display performance, the OLED display panel having $V_B-V_R=0.15$ V and $V_G-V_R=0.10$ V at the predetermined value of brightness has a better display performance than the OLED display panel in which the light-emitting devices 130 of any two colors have an absolute value of the threshold voltage difference less than or equal to approximately 0.2 V at the predetermined value of brightness.

In one embodiment, both the red light-emitting device R and the green light-emitting device G may include phosphorescent materials, and the blue light-emitting device B may include fluorescent materials. That is, the phosphorescent material may serve as the luminescent material for the red light-emitting device R and the green light-emitting device G, and the fluorescent material may serve as the luminescent material for the blue light-emitting device B.

The red phosphorescent materials adopted by the red light-emitting device R and the green phosphorescent materials adopted by the green light-emitting device may provide high luminous efficiency and long lifetime which meet the commercial requirements. The blue fluorescent material adopted by the blue light-emitting device B may provide a desired long lifetime to meet the commercial requirements. As a comparison, the lifetime of the blue phosphorescent material may be substantially short to meet the commercial requirements.

It should be noted that, the red light-emitting device R, the green light-emitting device G, and the blue light-emitting device B may have large difference in the external quantum efficiencies. For example, given a current density of 10 $mA/cm^2$, the external quantum efficiency of the red light-emitting device R may be greater than or equal to approximately 18%, the external quantum efficiency of the green light-emitting device G may be greater than or equal to approximately 18%, and the external quantum efficiency of the blue light-emitting device B may be greater than or equal to approximately 10%.

External quantum efficiency is explained as follows. When the photons are incident onto the surface of a photosensitive device, some of the photons will stimulate the photosensitive material to produce electron-hole pairs to create a current, in which the ratio between the number of the generated electrons and the number of all the incident photon is the external quantum efficiency.

Higher external quantum efficiency may indicate higher brightness of the light-emitting device. The undesired light emitted by the light-emitting devices adjacent to the turned-on light-emitting device in the existing OLED display panel as discussed in the background, may be related to the high brightness of the light-emitting devices. Because the external quantum efficiencies of the red light-emitting device R and the green light-emitting device G are substantially high, undesired light may be emitted by the red light-emitting device R and the green light-emitting device G.

In the disclosed embodiments, through providing the light-emitting devices of two different colors with a desired absolute value of the threshold voltage difference, the undesired light emitted by the light-emitting devices adjacent to the turned-on light-emitting device may be suppressed. Those skilled in the art would understand that, through providing the light-emitting devices of any two different colors with a desired absolute value of the threshold voltage difference, the undesired light emitted by the light-emitting devices adjacent to the turned-on light-emitting device may be suppressed in any appropriate OLED display panels, not only limited to the OLED display panels in which the undesired light emitted by the light-emitting devices is caused by high external quantum efficiency.

The luminescent materials of the light-emitting devices of different colors are for illustrative purposes and are not intended to limit the scope of the present disclosure. In one embodiment, the luminescent material of the light-emitting device of one color may include a composite material of phosphorescent materials and fluorescent materials. The luminescent materials of the light-emitting devices of different colors may be selected according to various application scenarios, which are not limited by the present disclosure.

In one embodiment, the red light-emitting device R may include one type of first host material or two types of first host materials, and the first host material may include a carbazole-containing compound. The green light-emitting device G may include at least two types of second host materials, and the second host material may include a carbazole-containing compound. The blue light-emitting device B may include one type of third host material or two types of third host materials, and the third host material may include an aromatic compound.

The carbazole compound may have a substantially high triplet energy, as well as the hole transport and electron transport properties. The carbazole compound included in the host material may enable the host material to have a sufficiently large triplet energy and carrier transport properties. The aromatic compound may have a large conjugated plane, as well as a relatively strong electron accepting ability and electron transport properties, but may not form a complex with luminescent materials.

Those skilled in the art would understand that a variety of carbazole-containing compounds may be used as the host material of the red light-emitting device, and a variety of carbazole-containing compounds may be used as the host material of the green light-emitting device, and a variety of aromatic compounds may be used as the host material of the blue light-emitting device, which are not limited by the present disclosure.

The light-emitting device 130 may be formed by at least a luminescent material (i.e., a guest dopant material) and at least a host material, and the luminescent material and the host material may influence the luminescent performance of the light-emitting device 130. Accordingly, the luminescent material and the host material may influence the threshold voltage of the light-emitting device 130. In the OLED display panel provided in the disclosed embodiments, the absolute value of the threshold voltage difference of the light-emitting devices 130 of any two colors at the predetermined value of brightness may be configured to be less than or equal to approximately 0.3 V, which may be realized through adjusting structures and materials of the light-emitting devices 130. That is, through adjusting structures and materials of the light-emitting devices 130, the threshold voltages of the light-emitting devices 130 of different colors may be adjusted.

In one embodiment, the red light-emitting device R may comprise a first host material (R-host) described in the following compound (1) and a phosphorescent material (R-dopant) described in the following compound (2):

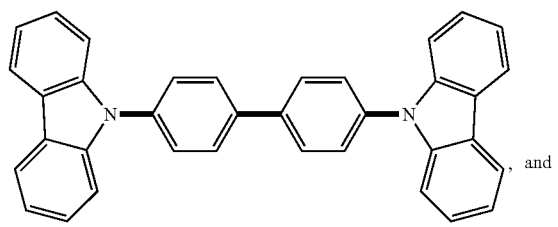
, and

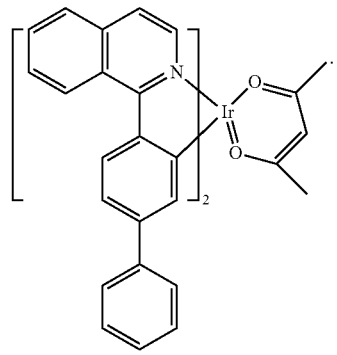

The green light-emitting device G may comprise a second host material (G-host1) described in the following compound (1), a second host material (G-host2) described in the following compound (2), and a phosphorescent material (G-dopant) described in the following compound (3):

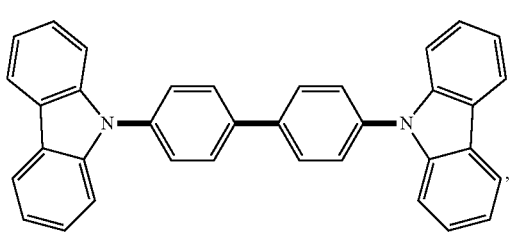

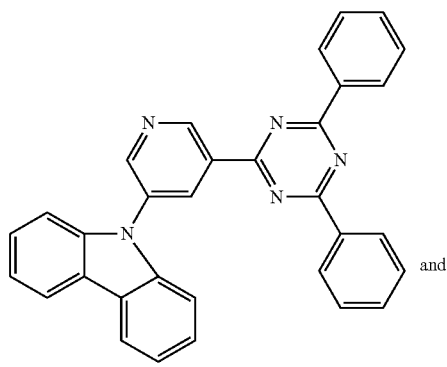
and

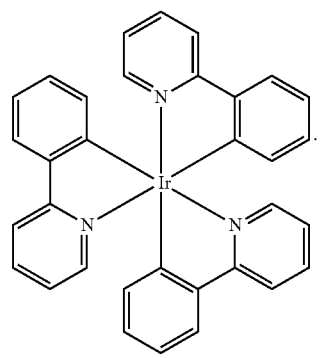

The blue light-emitting device B may comprise a third host material (B-host1) described in the following compound (4) or a third host material (B-host2) described in the following compound (5), and a fluorescent material (B-dopant) described in the following compound (6):

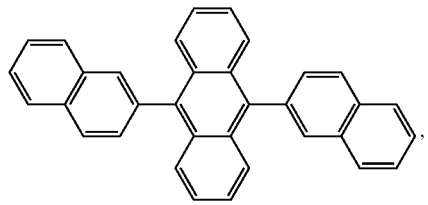

(4)

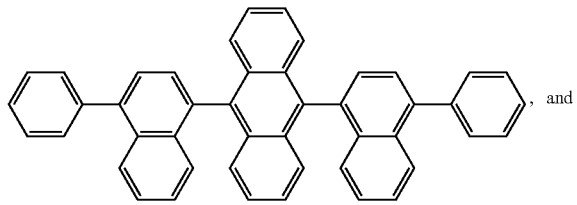
, and (5)

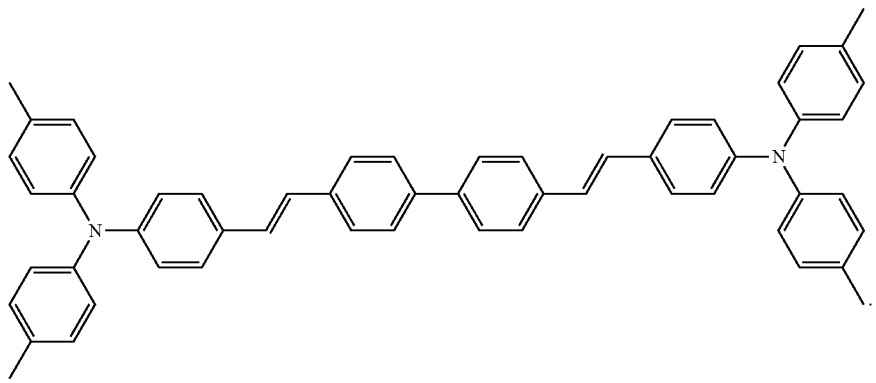

(6)

The compounds (1)-(6) may have good electron and hole transport properties without forming a complex with luminescent materials. The light-emitting devices formed by the compounds may have a long lifetime, high luminous efficiency, and good stability, etc., which is not further described here.

The luminescent materials and the host materials are for illustrative purposes and are not intended to limit the scope of the present disclosure. In practical applications, the luminescent materials and the host materials for the desired threshold voltages may be selected according to various application scenarios, which are not limited by the present disclosure.

Figure 3:
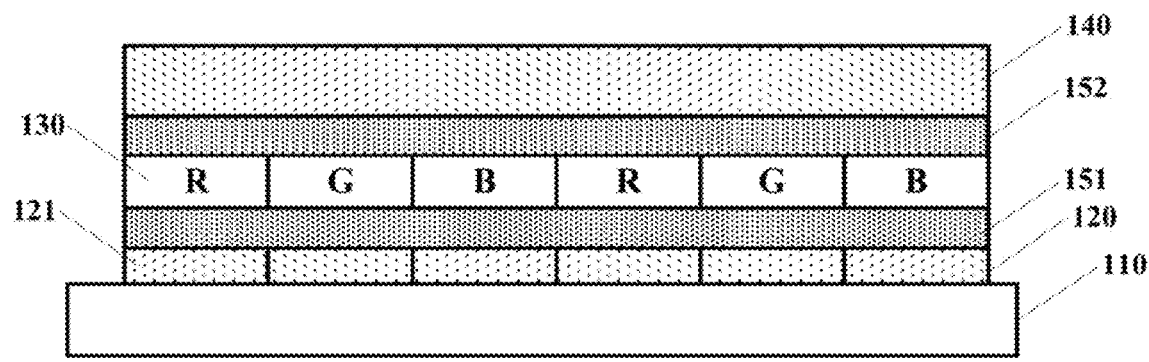
FIG. 3 illustrates a schematic view of another exemplary OLED display panel consistent with disclosed embodiments.

FIG. 3 illustrates a schematic view of another exemplary OLED display panel consistent with disclosed embodiments. The similarities between FIG. 3 and FIG. 2 may not be repeated here, while certain differences may be explained. As shown in FIG. 3, different from the OLED display panel 200 in FIG. 2, the OLED display panel 300 in FIG. 3 may further comprise a hole transport layer 151 and an electron transport layer 152.

In particular, the hole transport layer 151 may be disposed on the surface of the first electrode layer 120 far away from the first substrate 110. The electron transport layer 152 may be disposed on the plurality of light-emitting devices 130 far away from the first electrode layer 120.

The hole transport layer 151 may be disposed between the first electrode layer 120 and the plurality of light-emitting devices to improve the capability of the anode to inject and transport holes into the plurality of light-emitting devices 130. The electron transport layer 152 may be disposed between the plurality of light-emitting devices 130 and the second electrode layer 140, to improve the capability of the cathode to inject and transport electrons into the plurality of light-emitting devices 130. Accordingly, more holes and electrons may be injected into the light-emitting devices 130, and the luminous efficiency of the light-emitting devices 130 may be improved.

The hole transport layer 151 and the electron transport layer 152 may enhance the capability to inject and transport holes and electrons, thereby improving the exciton recombination efficiency of the light-emitting device 130. Thus, the hole transport layer 151 and the electron transport layer 152 may influence the threshold voltage of the light-emitting device 130. In the disclosed embodiments, through adjusting the structure and the material of the hole transport layer 151 and the electron transport layer 152, the threshold voltages of the light-emitting devices 130 of different colors may be adjusted accordingly.

In the disclosed embodiments, the hole transport layer 151 may include a first hole transport material (HTL1) described in the following compound (7), or may include a mixture (HTL1:HTL2) of a first hole transport material (HTL1) described in the following compound (7) and a second hole transport material (HTL2) described in the following compound (8):

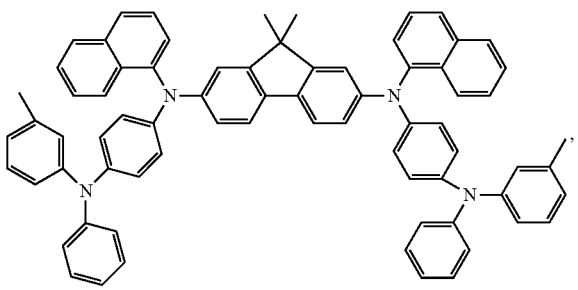

(7)

-continued (8)

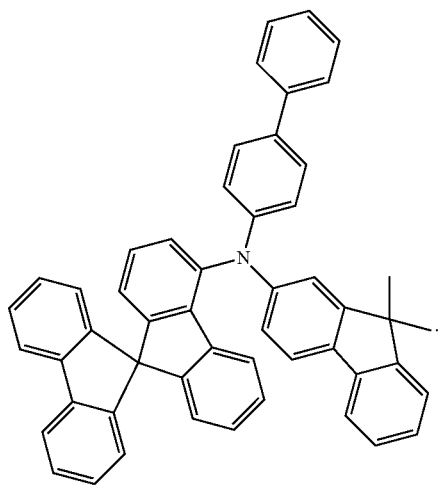

In the disclosed embodiments, the electron transport layer 152 may include a mixture (ETL1:ETL2) of a first electron transport material (ETL1) described in the following compound (9) and a second electron transport material (ETL2) described in the following compound (10); or the electron transport layer 152 may include a third electron transport material (ETL3) described in the following compound (11), further comprising a mixture (ETL1:ETL2) of the first electron transport material (ETL1) and the second electron transport material (ETL2) arranged in a stacked configuration and disposed on the film of the third electron transport material (ETL3), in which the film of the third electron transport material (ETL3) may be disposed on the surface of the light-emitting devices far away from the first electrode layer 120.

The chemical formulas of the compounds (9)-(11) are listed below:

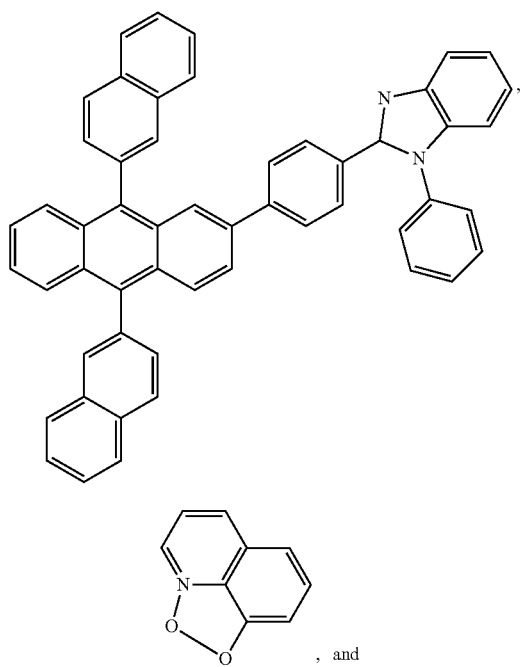

(9)

(10) , and

-continued (11)

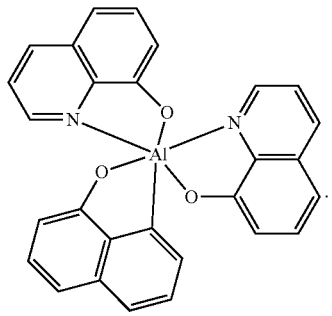

The hole transport materials may have high thermal stability and a small potential barrier with the anode. A vacuum evaporation process may also be adopted to form pinhole-free films of the hole transport materials and, accordingly, the hole injection and transport capacity may be substantially improved. The electron transport materials may have substantially high electron mobility, substantially high electron affinity to facilitate electron injection, and a substantially large ionization energy to block holes. Meanwhile, the electron transport materials may have good film-forming characteristics and good stability. Thus, the electron injection and transport capacity may be effectively improved.

Those skilled in the art would understand that, the hole transport materials and the electron transport materials are for illustrative purposes and are not intended to limit the scope of the present disclosure. In practical applications, the hole transport materials and the electron transport materials for the desired threshold voltages may be selected according to various application scenarios, which are not limited by the present disclosure.

Figure 4:
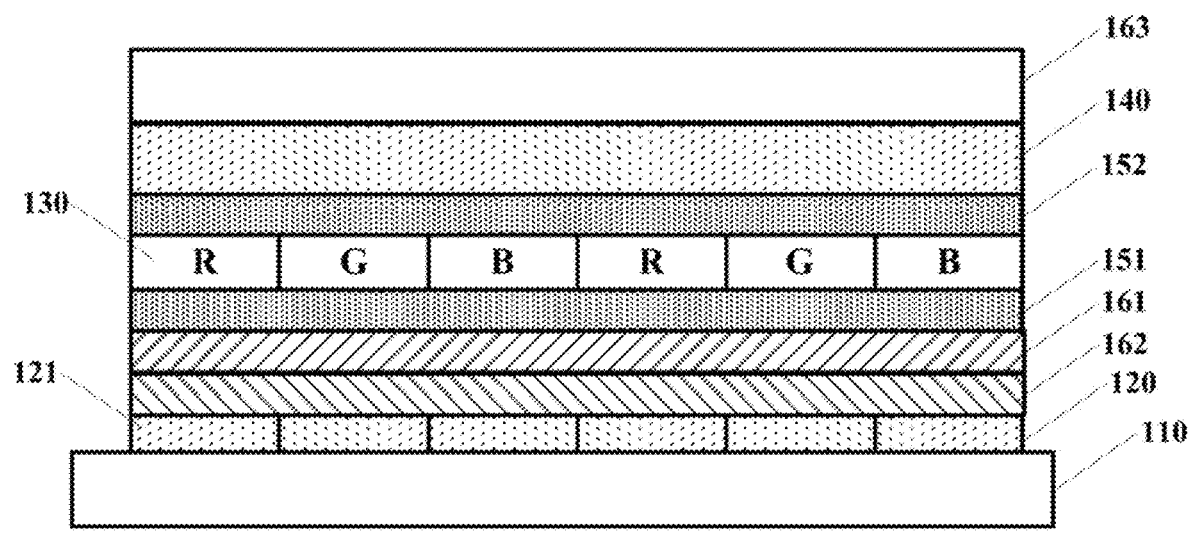
FIG. 4 illustrates a schematic view of another exemplary OLED display panel consistent with disclosed embodiments.

FIG. 4 illustrates a schematic view of another exemplary OLED display panel consistent with disclosed embodiments. The similarities between FIG. 4 and FIG. 3 may not be repeated here, while certain differences may be explained. As shown in FIG. 4, different from the OLED display panel 300 in FIG. 3, the OLED display panel 400 in FIG. 4 may further include a hole injection layer 161, a buffer layer 162, and a capping layer 163.

In particular, the hole injection layer 161 may be disposed on the surface of the hole transport layer 151 far away from the plurality of light-emitting devices 130. The buffer layer 162 may be disposed between the first electrode layer 120 and the hole injection layer 161. The capping layer 163 may be disposed on the surface of the second electrode layer 140 far away from the plurality of light-emitting device 130.

Both the hole injection layer 161 and the buffer layer 162 may be able to reduce the interfacial potential barrier between the first electrode layer 120 and the hole transport layer 151, and minimize the energy barrier when the holes are transited from the first electrode layer 120, thereby increasing the hole injection and transport capacity. Thus, more holes may be injected into the light-emitting devices 130, and, accordingly, the recombination efficiency and the luminous efficiency of the light-emitting devices 130 may be increased.

In certain embodiments, the OLED display panel may further comprise film structures such as an electron injection layer, an electron blocking layer, and a hole blocking layer. The film structure of the OLED display panel may vary according to various application scenarios. Film structures are not limited by the present disclosure.

In the disclosed embodiments, the hole injection layer 161 may include a hole injection material described in the following compound (12):

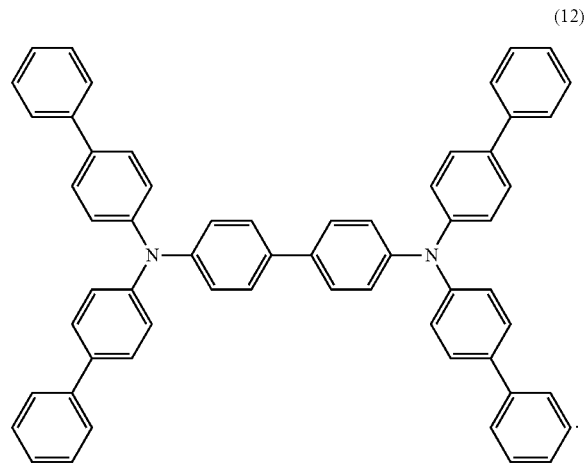 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1]

(12)

In the disclosed embodiments, the buffer layer 162 may include a buffer material described in the following compound (13):

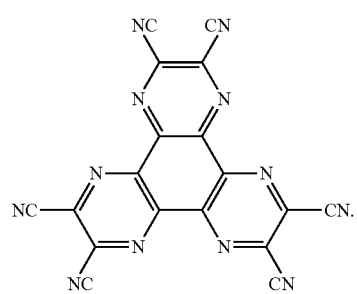

(13)

In the disclosed embodiments, the capping layer 163 may include a capping layer material described in the following compound (14):

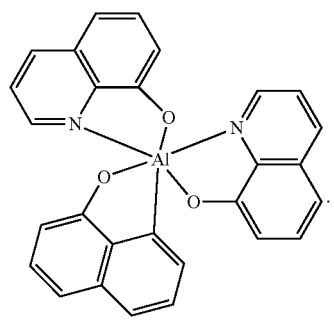

(14)

Those skilled in the art would understand that a variety of hole injection materials, buffer materials and capping layer materials may be selected for the OLED display panel, including, but not limited to the compounds (12)-(14). The hole injection materials, buffer materials and capping layer materials may be selected according to various application scenarios, which are not limited by the present disclosure.

Further, four OLED display panels (disclosed OLED display panels examples 1 to 3, and a comparative OLED display panel example 4) are given below to illustrate the influence of the structure and material of the transport layers and the light-emitting layer on the threshold voltages of the light-emitting devices. That is, through selecting the transport layers of different chemical structures as well as the light-emitting layer of different structures and materials, the threshold voltages of the light-emitting devices may be adjusted.

In the OLED display panels examples 1-4, only the buffer layer, the hole injection layer, the hole transport layer, the light-emitting devices, the electron transport layer, the second electrode layer (Cathode), and the capping layer of the OLED display panel of four examples are described below. The OLED display panel may also include other appropriate components, which are not illustrated here.

In the OLED display panels examples 1-4, the buffer layer may include a buffer material described in the following compound (13):

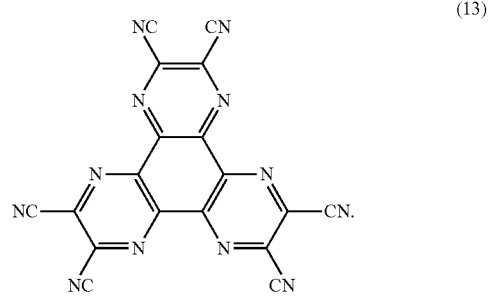

(13)

The hole injection layer may include a hole injection material (HIL1) described in the following compound (12):

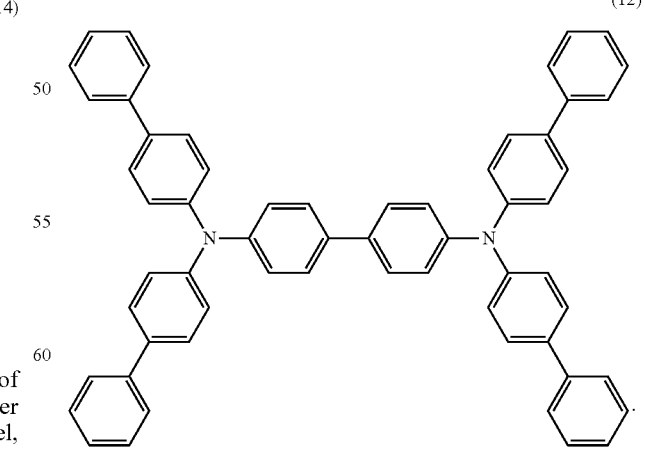

(12)

The capping layer may include a material (CPL) described in the following compound (14):

(14)

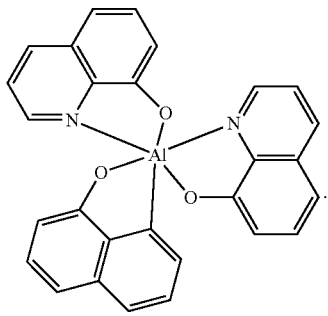

The cathode (Cathode) material may be same in the OLED display panels in examples 1-4, which is not defined here.

The structure of the OLED display panels examples 1-4 are listed below.

Example 1

R; Buffer/HIL1/HTL1/R-host:R-dopant/ETL1:ETL2/Cathode/CPL;
G: Buffer/HIL1/HTL1/G-host:G-dopant/ETL1:ETL2/Cathode/CPL;
B: Buffer/HIL1/HTL1/B-host2:B-dopant/ETL1:ETL2/Cathode/CPL.

Example 2

R: Buffer/HIL1/HTL1:HTL2/R-host:R-dopant/ETL1:ETL2/Cathode/CPL;
G: Buffer/HIL1/HTL1:HTL2/G-host:G-dopant/ETL1:ETL2/Cathode/CPL;
B: Buffer/HIL1/HIL1/B-host1:B-dopant/ETL1:ETL2/Cathode/CPL.

Example 3

R: Buffer/HIL1/HTL1/R-host:R-dopant/ETL3/ETL1:ETL2/Cathode/CPL;
G: Buffer/HIL1/HTL1/G-host:G-dopant/ETL3/ETL1:ETL2/Cathode/CPL;
B: Buffer/HIL1/HTL1/B-host1:B-dopant/ETL1:ETL2/Cathode/CPL.

Comparative Example 4

R: Buffer/HIL1/HTL1/R-host:R-dopant/ETL1:ETL2/Cathode/CPL;
G: Buffer/HIL1/HTL1/G-host:G-dopant/ETL1:ETL2/Cathode/CPL;
B: Buffer/HIL1/HTL1/B-host1:B-dopant/ETL1:ETL2/Cathode/CPL.

Other film structures and materials of the OLED display panels may be same in the OLED display panels of examples 1 to 3 and the comparative example 4, which are not described here. The inventors prepared the four OLED display panels examples 1 to 4 and tested the corresponding threshold voltages:

the OLED display panel example 1: $V_B-V_R=0.18V$, $V_G-V_R=0.15V$;
the OLED display panel example 2: $V_B-V_R=0.15V$, $V_G-V_R=0.14V$;
the OLED display panel example 3: $V_B-V_R=0.17V$, $V_G-V_R=0.15V$; and
The OLED display panel example 4: $V_B-V_R=0.6V$, $V_G-V_R=0.2V$.

The testing results are explained as follow.

In the OLED display panel shown in example 1, when a light-emitting device 130 of any color is turned on, the OLED display panel emits light evenly, and undesired light is not emitted by the light-emitting devices 130 adjacent to the turned-on light-emitting device 130.

In the OLED display panel shown in example 2, when a light-emitting device 130 of any color is turned on, the OLED display panel emits light evenly, and undesired light is not emitted by the light-emitting devices 130 adjacent to the turned-on light-emitting device 130.

In the OLED display panel shown in example 3, when a light-emitting device 130 of any color is turned on, the OLED display panel emits light evenly, and undesired light is not emitted by the light-emitting devices 130 adjacent to the turned-on light-emitting device 130.

In the OLED display panel shown in the comparative example 4, when a blue light-emitting device B is turned on, undesired light is emitted by the red light-emitting devices R and the green light-emitting devices G adjacent to the turned-on blue light-emitting device B.

According to the testing results, the OLED display panel in which the light-emitting devices of any two colors have an absolute value of the threshold voltage difference less than or equal to approximately 0.3 V at the predetermined value of brightness, may have better display performance than the OLED display panel in which the light-emitting devices of any two colors have an absolute value of the threshold voltage difference greater than approximately 0.3 V.

Figure 5:
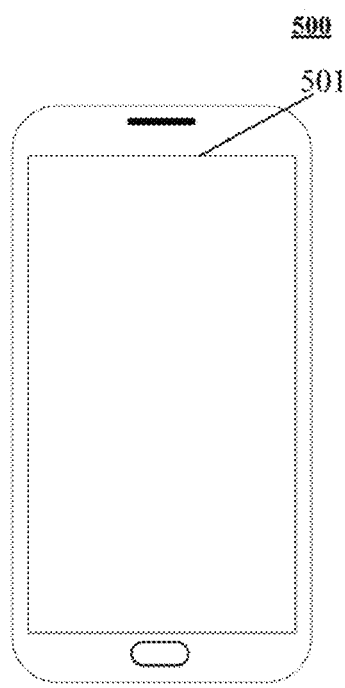
FIG. 5 illustrates a schematic view of an exemplary OLED display device consistent with disclosed embodiments.

The present disclosure also provides an OLED display device. FIG. 5 illustrates a schematic view of an exemplary OLED display device 500 consistent with disclosed embodiments. As shown in FIG. 5, the OLED display device 500 may include any one of the disclosed OLED display panels 501. The disclosed OLED display device 500 may be a cell phone, a tablet, a monitor, and a smart wearable display device, etc. Any OLED display device comprising any one of the disclosed OLED display panels will fall within the scope of the present disclosure. Although a smart phone is shown in FIG. 5, the disclosed OLED display device is not limited to the smart phone.

In one embodiment, the OLED display panel may have a top-emitting structure, in which the light generated by the light-emitting device is transmitted outside through the surface on the same side as the second electrode layer. In another embodiment, the OLED display panel may have a bottom-emitting structure, in which the light generated by the light-emitting device is transmitted outside through the surface on the same side as the first electrode. In another embodiment, the OLED display panel may have a double-sided light-emitting structure, in which the light generated by the light-emitting device is transmitted outside through the surface on the same side as the second electrode layer and the surface on the same side as the first electrode simultaneously.

Those skilled in the art would understand that the film materials and properties may be selected according to various application scenarios. In one embodiment, when the OLED) display panel has a top-emitting structure, semi-transparent or transparent conductive materials may be selected for the second electrode layer. In another embodiment, when the OLED display panel has a bottom-emitting structure, the light transmittance of the second electrode layer may not have to be defined.

In one embodiment, the light-emitting devices may include light-emitting materials of different colors. For example, a red light-emitting device may be formed of a red light-emitting material, a green light-emitting material may be formed of a green light-emitting material, and a blue light-emitting device may be formed of a blue light-emitting material.

Figure 6:
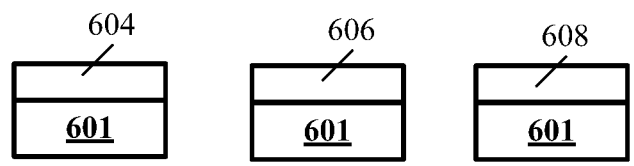
FIG. 6 illustrates exemplary light-emitting devices consistent with disclosed embodiments.

In another embodiment, the light-emitting device may comprise a white light-emitting element and a color filter film (i.e., a color resist film). For example, the red light-emitting device may comprise a white light-emitting element and a red filter film which are arranged in layers; the green light-emitting device may comprise a white light-emitting element and a green filter film which are arranged in layers; the blue light-emitting device may comprise a white light-emitting element and a blue filter film arranged in layers. For example, as shown in FIG. 6, a red light-emitting device may include a red filter film 604 arranged over a white light-emitting element 601; a green light-emitting device may include a green filter film 606 arranged over a white light-emitting element 601; and a blue light-emitting device may include a blue filter film 608 arranged over a white light-emitting element 601.

Further, the light-emitting element and the filter film may be arranged according to the light-emitting structure of the OLED display panel. For example, a color filter film in the top-emitting light-emitting structure may be disposed on the surface of the light-emitting element far away from the first electrode layer.

In the disclosed OLED display panels, the first electrode layer may include a plurality of electrode blocks or a plurality of striped electrodes, and the second electrode layer may be a sheet electrode or include a plurality of striped electrodes. The electrode shapes and structures are for illustrative purposes and are not intended to limit the scope of the present disclosure. The electrode shapes and structures may vary according to various application scenarios.

The disclosed OLED display panel may comprise a first substrate, a first electrode layer, a plurality of light-emitting devices, a second electrode layer, and a plurality of first electrodes. The first electrode layer may be disposed on the first substrate and may comprise the plurality of first electrodes. The plurality of light-emitting devices may be disposed on the first electrode layer far away from the first substrate and may be disposed in correspondence with the plurality of first electrodes, respectively.

The plurality of light-emitting devices may have m number of colors, where m is a positive integer greater than or equal to 3. At the predetermined value of brightness, the light-emitting devices of any two colors may have an absolute value of the threshold voltage difference less than or equal to approximately 0.3 V. The second electrode layer may be disposed on the plurality of light-emitting devices far away from the first electrode layer.

Through providing the light-emitting devices of any two different colors with a desired absolute value of the threshold voltage difference, the undesired light emitted by the light-emitting devices adjacent to the turned-on light-emitting device may be suppressed. Accordingly, the crosstalk of the OLED display panels and devices may be reduced, and the performance of the OLED display panels and devices may be improved.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An organic light-emitting diode (OLED) display panel, comprising:
    a first substrate;
    a first electrode layer disposed on the first substrate and including a plurality of first electrodes;
    a plurality of light-emitting devices disposed on the plurality of first electrodes and having m number of colors, m being a positive integer;
    a hole transport layer disposed on the first electrode layer;
    an electron transport layer disposed on the hole transport layer;
    a second electrode layer disposed on the electron transport layer,
    wherein:
        one light-emitting device corresponds to one color,
        the plurality of light-emitting devices are formed by different materials, each light-emitting device at least including a luminescent material and a host material,
        a structure and a material for each of the hole transport layer and the electron transport layer, as well as the luminescent material and the host material of one light-emitting device determines a threshold voltage feature of the one light-emitting device, wherein the hole transport layer includes a first hole transport material including a compound (7):

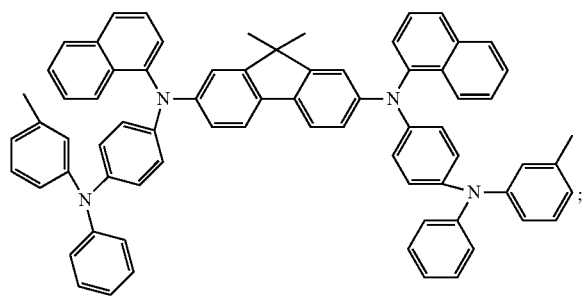

(7)

when a voltage applied to a first electrode and a second electrode of a corresponding light-emitting device equals to a threshold voltage feature of the corresponding light-emitting device, the corresponding light-emitting device emit lights recognizable to human eyes, and
any two light-emitting devices of different colors are made having different threshold voltage features with a difference having an absolute value less than or equal to 0.3 V to provide the OLED display panel.

2. The OLED display panel according to claim 1, wherein: m is greater than or equal to 3.

3. The OLED display panel according to claim 1, wherein: a minimum luminance value of each light-emitting device is less than or equal to approximately 0.1 cd/m$^2$.

4. The OLED display panel according to claim 1, wherein: the absolute value of the difference of the different threshold voltage features of any two light-emitting devices of different colors is less than or equal to 0.2 V.

5. The OLED display panel according to claim 1, wherein: the plurality of light-emitting devices include a plurality of red light-emitting devices, a plurality of green light-emitting devices, and a plurality of blue light-emitting devices.

6. The OLED display panel according to claim 5, wherein:
the absolute value of the difference in threshold voltage features between a red light-emitting device and a green light-emitting device is less than or equal to approximately 0.1 V; and
the absolute value of the difference in the threshold voltage features between a red light-emitting device and a blue light-emitting device is less than or equal to approximately 0.2V.

7. The OLED display panel according to claim 5, wherein:
a red light-emitting device comprises a white light-emitting element and a red filter film arranged in layers;
a green light-emitting device comprises a white light-emitting element and a green filter film arranged in layers; and
a blue light-emitting device comprises a white light-emitting element and a blue filter film arranged in layers.

8. The OLED display panel according to claim 5, wherein:
both a red light-emitting device and a green light-emitting device include a phosphorescent material; and
a blue light-emitting device includes a fluorescent material.

9. The OLED display panel according to claim 8, wherein:
the red light-emitting device includes one type of first host material or two types of first host materials, and the first host material includes a carbazole-containing compound;
the green light-emitting device includes at least two types of second host materials, and the at least two types of second host materials include a carbazole-containing compound; and
the blue light-emitting device includes one type of third host material or two types of third host materials, and the third host material includes an aromatic compound.

10. The OLED display panel according to claim 1, wherein:
the hole transport layer further includes a second hole transport material including a compound (8), (8)

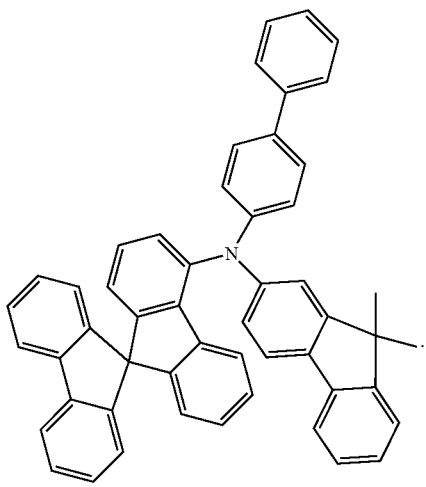

11. The OLED display panel according to claim 1, wherein the first electrode layer further includes at least:
a reflective film disposed on the first substrate and including a silver; and
a transparent conductive film disposed on a surface of the reflective film far away from the first substrate, and including indium tin oxide or indium zinc oxide.

12. The OLED display panel according to claim 1, wherein:
the second electrode layer includes at least one of a magnesium-silver alloy, a silver metal, a silver-ytterbium alloy, and a silver-rare earth metal alloy.

13. The OLED display panel according to claim 1, wherein:
the first substrate is a flexible substrate or a rigid substrate.

14. The OLED display panel according to claim 13, wherein:
the flexible substrate includes polyimide or a polyethylene terephthalate resin.

15. The OLED display panel according to claim 1, further including:
a hole injection layer disposed on a surface of the hole transport layer far away from the plurality of light-emitting devices;
a buffer layer disposed between the first electrode layer and the hole injection layer; and
a capping layer disposed on a surface of the second electrode layer far away from the plurality of light-emitting device.

16. An organic light-emitting diode (OLED) display device, comprising the OLED display panel according to claim 1.

17. An organic light-emitting diode (OLED) display panel, comprising:
a first substrate;
a first electrode layer disposed on the first substrate and including a plurality of first electrodes;
a plurality of light-emitting devices disposed on a surface of the first electrode layer far away from the first substrate and having m number of colors, where m is a positive integer, wherein:
one light-emitting device corresponds to one color,
one light-emitting device is made to have one minimum luminance value recognizable to human eyes, and the one minimum luminance value corresponds to one minimum effective voltage determined by the one light-emitting device,
the light-emitting devices of two different colors are made different and have a difference in minimum effective voltages, and an absolute value of the difference in the minimum effective voltages of the light-emitting devices of two different colors is less than or equal to approximately 0.3 V;
a second electrode layer disposed on a surface of the plurality of light-emitting devices far away from the first electrode layer;
the plurality of light-emitting devices include a plurality of red light-emitting devices, a plurality of green light-emitting devices, and a plurality of blue light-emitting devices;
the red light-emitting device includes a first host material described in a compound (1) and a phosphorescent material described in a compound (2);
the green light-emitting device includes a second host material described in the compound (1) and a phosphorescent material described in a compound (3); and
the blue light-emitting device includes a third host material described in either a compound (4) or a compound (5) and a fluorescent material described in a compound (6), wherein the compounds (1)-(6) are

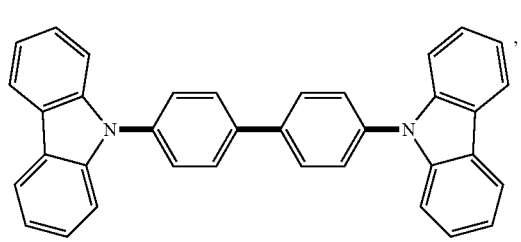
(1)
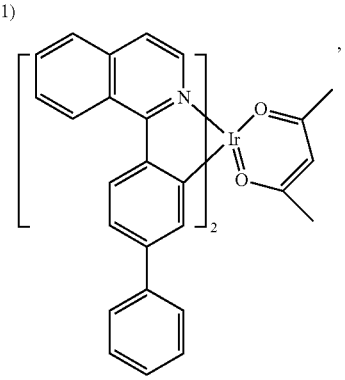
(2)
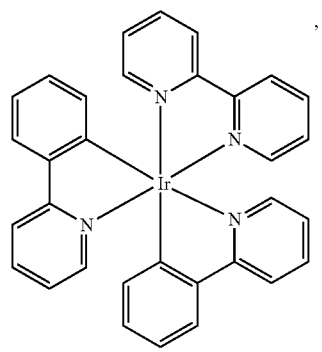
(3)
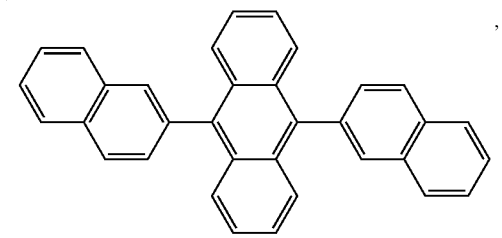
(4)
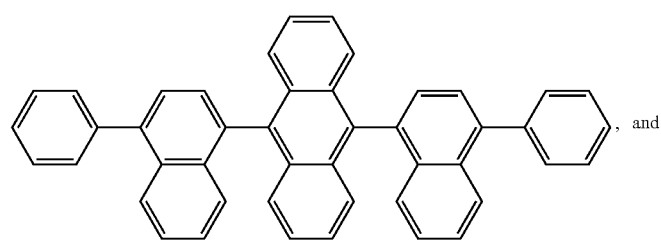
, and
(5)
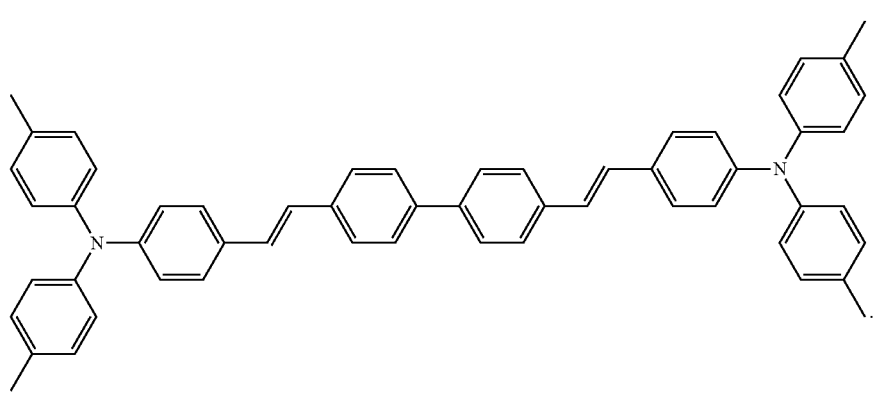
.
(6)

18. An organic light-emitting diode (OLED) display panel, comprising:
a first substrate;
a first electrode layer disposed on the first substrate and including a plurality of first electrodes;
a plurality of light-emitting devices disposed on a surface of the first electrode layer far away from the first substrate and having m number of colors, where m is a positive integer, wherein:
one light-emitting device corresponds to one color,
one light-emitting device is made to have one minimum luminance value recognizable to human eyes, and the one minimum luminance value corresponds to one minimum effective voltage determined by the one light-emitting device,
the light-emitting devices of two different colors are made different and have a difference in minimum effective voltages, and an absolute value of the difference in the minimum effective voltages of the light-emitting devices of two different colors is less than or equal to approximately 0.3 V;
a second electrode layer disposed on a surface of the plurality of light-emitting devices far away from the first electrode layer;
a hole transport layer disposed on the surface of the first electrode layer far away from the first substrate; and
an electron transport layer disposed on the surface of the plurality of light-emitting devices far away from the first electrode layer, wherein:
the electron transport layer includes a mixture of a first electron transport material described in a compound (9) and a second electron transport material described in a compound (10); or
the third electron transport layer includes a third electron transport material described in a compound (11), and a mixture of the first electron transport material and the second electron transport material arranged in a stacked configuration and disposed on a film of the third electron transport material, in which the film of the third electron transport material is disposed on the surface of the plurality of light-emitting devices far away from the first electrode layer, wherein the compounds (9)-(11) are

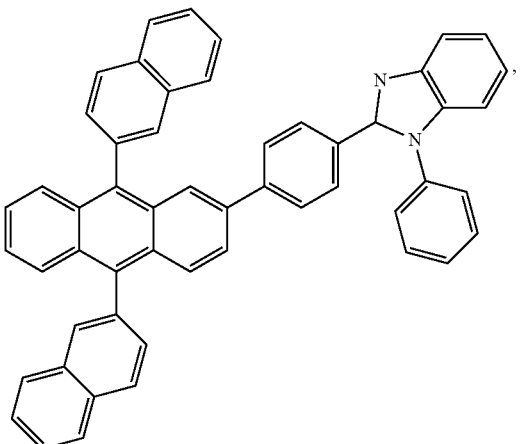
(9)

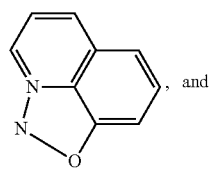, and
(10)

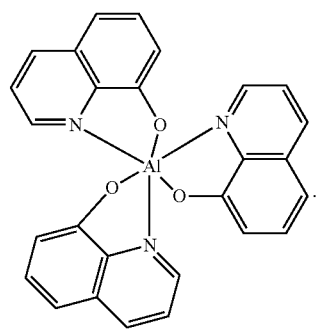.
(11)

* * * * *